United States Patent
Iandola et al.

(10) Patent No.: US 11,157,014 B2
(45) Date of Patent: Oct. 26, 2021

(54) MULTI-CHANNEL SENSOR SIMULATION FOR AUTONOMOUS CONTROL SYSTEMS

(71) Applicant: Tesla, Inc., Palo Alto, CA (US)

(72) Inventors: Forrest Nelson Iandola, San Jose, CA (US); Donald Benton MacMillen, Hillsborough, CA (US); Anting Shen, Berkeley, CA (US); Harsimran Singh Sidhu, Fremont, CA (US); Daniel Paden Tomasello, Los Altos Hills, CA (US); Rohan Nandkumar Phadte, San Jose, CA (US); Paras Jagdish Jain, Cupertino, CA (US)

(73) Assignee: Tesla, Inc., Palo Alto, CA (US)

( * ) Notice: Subject to any disclaimer, the term of this patent is extended or adjusted under 35 U.S.C. 154(b) by 526 days.

(21) Appl. No.: 15/855,749

(22) Filed: Dec. 27, 2017

(65) Prior Publication Data

US 2018/0188733 A1 Jul. 5, 2018

Related U.S. Application Data

(60) Provisional application No. 62/440,289, filed on Dec. 29, 2016, provisional application No. 62/530,788, filed on Jul. 10, 2017.

(51) Int. Cl.
*G05D 1/02* (2020.01)
*G06N 3/04* (2006.01)
(Continued)

(52) U.S. Cl.
CPC .......... *G05D 1/024* (2013.01); *G05D 1/0246* (2013.01); *G05D 1/0255* (2013.01);
(Continued)

(58) Field of Classification Search
None
See application file for complete search history.

(56) References Cited

U.S. PATENT DOCUMENTS

2003/0146869 A1    8/2003   Lin et al.
2007/0280528 A1   12/2007   Wellington et al.
(Continued)

OTHER PUBLICATIONS

Bojarski, M. et al., "End to End Learning for Self-Driving Cars," Apr. 25, 2016, nine pages.
(Continued)

*Primary Examiner* — Peter D Nolan
*Assistant Examiner* — Demetra R Smith-Stewart
(74) *Attorney, Agent, or Firm* — Knobbe, Martens, Olson & Bear, LLP

(57) ABSTRACT

An autonomous control system combines sensor data from multiple sensors to simulate sensor data from high-capacity sensors. The sensor data contains information related to physical environments surrounding vehicles for autonomous guidance. For example, the sensor data may be in the form of images that visually capture scenes of the surrounding environment, geo-location of the vehicles, and the like. The autonomous control system simulates high-capacity sensor data of the physical environment from replacement sensors that may each have lower capacity than high-capacity sensors. The high-capacity sensor data may be simulated via one or more neural network models. The autonomous control system performs various detection and control algorithms on the simulated sensor data to guide the vehicle autonomously.

30 Claims, 6 Drawing Sheets

(51) Int. Cl.
*G06N 20/00* (2019.01)
*G06N 3/08* (2006.01)
*G06F 30/15* (2020.01)
*G06F 30/20* (2020.01)

(52) U.S. Cl.
CPC ........... *G05D 1/0257* (2013.01); *G06F 30/15* (2020.01); *G06F 30/20* (2020.01); *G06N 3/0454* (2013.01); *G06N 3/084* (2013.01); *G06N 20/00* (2019.01)

(56) References Cited

U.S. PATENT DOCUMENTS

| | | |
|---|---|---|
| 2010/0106356 A1 | 4/2010 | Trepagnier et al. |
| 2012/0083959 A1* | 4/2012 | Dolgov .................. G01S 17/86 701/23 |
| 2015/0317284 A1 | 11/2015 | Takahashi |
| 2016/0210382 A1 | 7/2016 | Alaniz et al. |
| 2016/0210775 A1 | 7/2016 | Alaniz et al. |
| 2016/0314224 A1* | 10/2016 | Wei ......................... G06F 30/20 |
| 2017/0109928 A1* | 4/2017 | Micks .................... G09B 9/042 |
| 2017/0123428 A1* | 5/2017 | Levinson ................. G07C 5/08 |
| 2017/0213149 A1* | 7/2017 | Micks ................ G06K 9/00825 |
| 2017/0364776 A1* | 12/2017 | Micks .................... G01S 13/006 |

OTHER PUBLICATIONS

Eigen, D. et al., "Depth Map Prediction from a Single Image using a Multi-Scale Deep Network," 2014, nine pages.
Eigen, D. et al., "Predicting Depth, Surface Normals and Semantic Labels with a Common Multi-Scale Convolutional Architecture," Dec. 17, 2015, nine pages.
Gupta, S. et al., "Learning Rich Features from RGB-D Images for Object Detection and Segmentation," Jul. 22, 2014, 16 pages.
He, K et al., "Deep Residual Learning for Image Recognition," Dec. 10, 2015, 12 pages.
Karpathy, A. et al., "Large-Scale Video Classification with Convolutional Neural Networks," 2014, eight pages.
PCT Invitation to Pay Additional Fees, PCT Application No. PCT/US17/68567, dated Mar. 6, 2018, 2 pages.
PCT International Search Report and Written Opinion, PCT Application No. PCT/US17/68567, dated May 1, 2018, 19 pages.
PCT International Search Report and Written Opinion, PCT Application No. PCT/US18/24197, dated Jun. 6, 2018, 15 pages.
Simonyan, K. et al., "Two-Stream Convolutional Networks for Action Recognition in Videos," Nov. 12, 2014, 11 pages.
Žbontar, J. et al., "Stereo Matching by Training a Convolutional Neural Network to Compare Image Patches," Journal of Machine Learning Research 17, Apr. 2016, pp. 1-32.

* cited by examiner

MULTI-CHANNEL SENSOR SIMULATION FOR AUTONOMOUS CONTROL SYSTEMS

CROSS-REFERENCE TO RELATED APPLICATIONS

This application claims the benefit of provisional U.S. Application No. 62/440,289, filed on Dec. 29, 2016, and provisional U.S. Application No. 62/530,788, filed on Jul. 10, 2017, each of which is incorporated herein by reference in its entirety.

GOVERNMENT SUPPORT CLAUSE

This invention was made with government support under SBIR Phase I Grant Award No. 1648576 awarded by the National Science Foundation. The government has certain rights in the invention.

BACKGROUND

This invention relates generally to autonomous control systems for vehicles, and more particularly to autonomous control systems for vehicles using sensors.

Autonomous control systems are systems that guide vehicles (e.g., automobiles, trucks, vans) without direct guidance by human operators. Autonomous control systems analyze the surrounding physical environment in various ways to guide vehicles in a safe manner. For example, an autonomous control system may detect and/or track objects in the physical environment, and responsive to a detected object, guide the vehicle away from the object such that collision with the object can be avoided. As another example, an autonomous control system may detect boundaries of lanes on the road such that the vehicle can be guided within the appropriate lane with the flow of traffic. The input to autonomous control systems is information related to the physical environment surrounding the vehicles that are detected by one or more sensors. Often times, the sensors are high-capacity sensors that are complex, expensive, and bulky.

SUMMARY

An autonomous control system combines sensor data from multiple sensors to simulate sensor data from high-capacity sensors. The sensor data contains information related to physical environments surrounding vehicles for autonomous guidance. For example, the sensor data may be in the form of images that visually capture scenes of the surrounding environment, geo-location of the vehicles, and the like.

High-capacity sensors are sensors that may have improved characteristics over other sensors in terms of, for example, resolution, field-of-view, or the like. A small number of high-capacity sensors may be sufficient to collect a substantial amount of information on the environment. However, high-capacity sensors can be costly and complex. In one embodiment, the high-capacity sensors include light detection and ranging (LIDAR) sensors that have a 360-degree field of view for data collection.

In contrast, some sensors may have smaller capacity than high-capacity sensors, but may be relatively inexpensive, portable, and readily available than high-capacity sensors. In one embodiment, the autonomous control system simulates high-capacity sensor data of the physical environment from a combination of replacement sensors that may each have lower capacity than high-capacity sensors. In one embodiment, the high-capacity sensor data is simulated via one or more neural networks. The autonomous control system performs various detection and control algorithms on the simulated sensor data to guide the vehicle autonomously.

The autonomous control system allows vehicles that lack expensive and complex high-capacity sensors to achieve autonomous guidance even with information from sensors that may have lower capacity than these high-capacity sensors. In addition, the autonomous control system can take advantage of existing detection and control systems, since many detection and control systems may be configured for high-capacity sensor data.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Overview

Figure 1A:
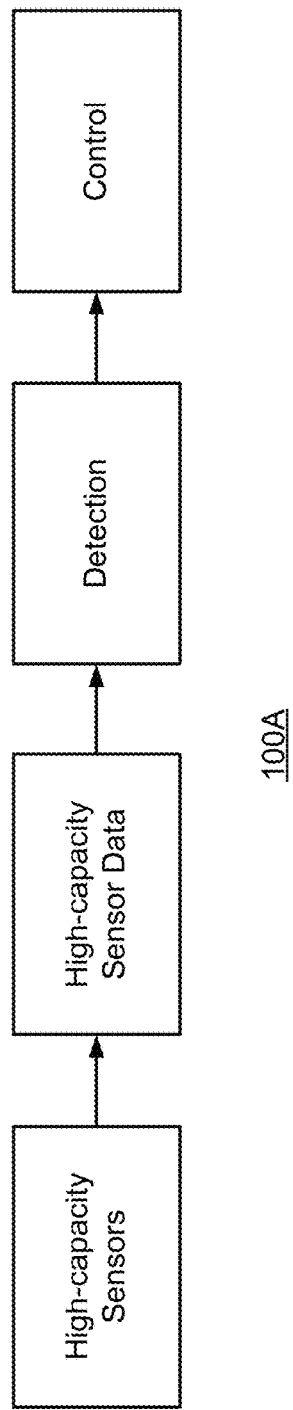
FIG. 1A illustrates a general process of an autonomous control system using high-capacity sensor data, in accordance with an embodiment.
Figure 1B:
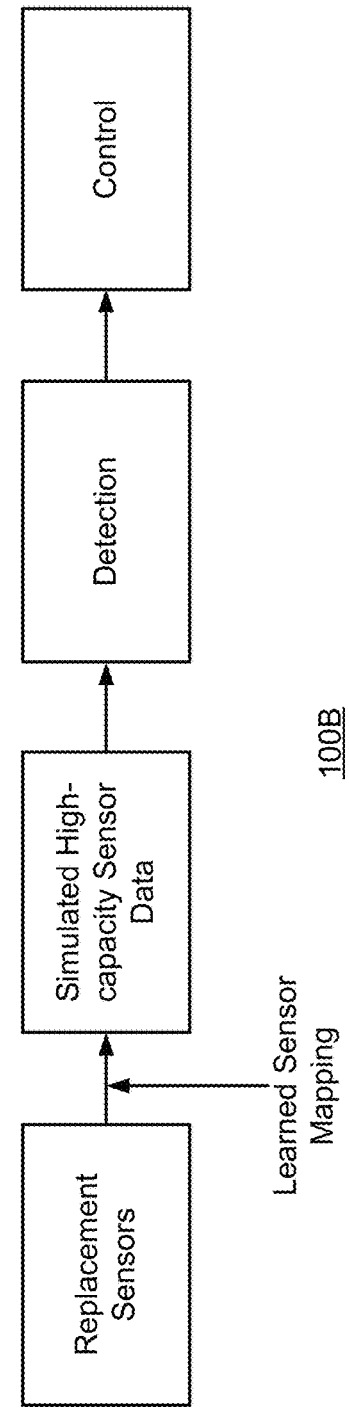
FIG. 1B illustrates a general process of an autonomous control system with high-capacity sensor simulation, in accordance with an embodiment.

FIG. 1A illustrates a general process 100A of an autonomous control system using high-capacity sensor data, in accordance with an embodiment. FIG. 1B illustrates a general process 100B of an autonomous control system with high-capacity sensor simulation, in accordance with an embodiment. These processes may be performed by an autonomous control system, for example as shown in the network 200 of FIG. 2.

The autonomous control system guides vehicles based on information related to the surrounding environment received from one or more sensors attached to the vehicles. The vehicles are any means of conveyance or transport in or by which someone or something can travel from one place to another, and may include automobiles, trucks, vans, robotic transports, and the like. The autonomous control system may guide a vehicle through one or more trips from one destination to another. For example, the autonomous control system may guide a ride-sharing vehicle (e.g., a taxi) from a passenger's point of pick-up to their desired destination. Though described herein as an autonomous vehicle, the control decisions of the autonomous controls system may provide semi-autonomous control rather than complete control of the vehicle, for example to supplement or override user control, or as primary means of control that can be overridden by a user. In addition, although the autonomous control system is described herein as a system that guides vehicles, the autonomous control system may also guide other systems such as robotic arms or manufacturing equipment.

One or more sensors can be attached to the vehicles to gather information used to generate the control of the vehicle. The sensors are devices that detect information related to the physical environment. The information can be captured through many forms. For example, the sensors may be imaging sensors that capture scenes of the physical environment through a series of one or more images. In such an example, other vehicles proximate to the vehicle of the autonomous control system, stationary objects such as trees, fire hydrants, lamp posts, and the like may be captured in the images. As another example, the sensors may be geo-locational sensors, and more specifically global positioning system (GPS) sensors that detect the position of the sensor (and its attached vehicle) relative to a map of the physical environment.

The autonomous control system performs various detection and control algorithms based on the physical environment information to guide the vehicles in a safe and efficient manner. For example, the autonomous control system may detect various objects (e.g., lamp post, cars) that are proximate to a vehicle in the captured images of the environment, and guide the vehicle away from the objects to prevent collision of the vehicle with the objects. As another example, the autonomous control system may detect boundaries of lanes on the road such that the vehicle can be guided within the appropriate lane with the flow of traffic.

Some sensors may have improved characteristics over others. For example, high-capacity imaging sensors may generate images having improved image characteristics, such as increased resolution, data collection time, sharpness, field-of-view, and the like, compared to other sensors. As another example, high-capacity geo-locational sensors may pinpoint the location of the sensor more accurately than others. As another example, some high-capacity sensors are able to detect information at a level of accuracy or precision that other sensors cannot. For example, light detection and ranging (LIDAR) sensors can measure the distance from the sensor to an object at a level of accuracy that is difficult to achieve for image sensors. Alternatively, more-sophisticated LIDAR sensors may generate greater precision data than less-sophisticated LIDAR sensors. In general, high-capacity sensors tend to be complex, expensive, and bulky. Moreover, it may be difficult for an owner (or a manufacturer) of a vehicle to purchase and install high-capacity sensors separately on his or her vehicle.

On the other hand, due to their high capacity, only a few or even a single high-capacity sensor may be needed to collect a substantial amount of information on the physical environment for accurate performance of the autonomous control system. For example, a single LIDAR sensor on a vehicle can capture a 360-degree field-of-view of the physical environment through high-resolution signals that may be alone sufficient for accurate performance of the autonomous control system.

In contrast, some sensors may have smaller capacity than high-capacity sensors, but may be more readily available than high-capacity sensors in that they are portable, easier to install, and relatively inexpensive. For example, a vehicle may include sensors at the front and/or back of the car that provide real-time images of the surroundings such that the operator can detect objects to avoid collisions with the object. However, these sensors have limited field-of-view that captures only a portion of the environment at the front and/or back of the vehicle. As another example, portable radio detection and ranging (RADAR) sensors may be able to detect distance of objects better than imaging sensors, but still may not have the accuracy as a high-capacity LIDAR sensor. As another example, portable cameras are easy to install on windshield or dashboard areas of the vehicle, but may lack the resolution and field-of-view of LIDAR sensors.

In contrast to high-capacity sensors, each sensor in a set of low-capacity sensors may provide fragments of information on the surrounding environment in different formats of sensor data and have lower precision information. However, the combination of sensor data as disclosed herein may contain information comparable to that generated from high-capacity sensors. For example, a vehicle may have a RGB camera with a first resolution at the back of a vehicle, a greyscale camera with a second resolution at the dashboard of the vehicle, another RGB camera with a third resolution at the left and right sides of the vehicle, and a portable RADAR sensor. Individually, each camera has a fragmented field-of-view limited to one among the front, back, and sides of the vehicle in different resolutions and color, and the portable RADAR sensor has sub-optimal distance measurements. Through the analysis and modeling of these sensors discussed herein, the sensors together may contain information on objects and the physical environment that is comparable to a high-capacity LIDAR sensor by simulating the high-capacity sensor output with a learned sensor mapping from the sensors to the desired high-capacity sensor data.

In one embodiment, the autonomous control system may perform the detection and control algorithms on sensor data generated by high-capacity sensors. As shown in FIG. 1A, the autonomous control system receives high-capacity sensor data. The autonomous control system detects and tracks one or more objects identified in the representation of the physical environment by high-capacity sensor data. The autonomous control system controls the vehicle based on the detected objects to guide the vehicle autonomously. In general, the detection and control systems are relatively accurate when using high-capacity sensor data, since a substantial amount of information on the surrounding environment is contained through a single type of sensor data. However, as described above, many vehicles may lack high-capacity sensors due to their complexity and cost.

In one embodiment, the autonomous control system may perform the detection and control algorithms on sensor data generated by replacement sensors having different capacity than high-capacity sensors that do not natively capture the precision or quality of sensor data available from the high-capacity sensor(s). Specifically, the autonomous control system simulates high-capacity sensor data from sensor data generated by a set of replacement sensors. Specifically, as shown in FIG. 1B, the autonomous control system receives sensor data from replacement sensors that differ from the high-capacity sensors, and may have different characteristics from one another, attached at various positions of the vehicle, or capture different fields of view. The autonomous control system synthesizes the combination of sensor data with a learned sensor mapping to simulate high-capacity sensor data as though the surrounding environment was characterized by high-capacity sensors. The autonomous control system detects one or more objects based on the simulated high-capacity sensor data to control the vehicle for autonomous guidance.

In one embodiment, the simulated high-capacity sensor data is synthesized through one or more machine-learned models. The one or more machine-learned models may be neural networks such as deep neural networks (DNN), convolutional neural networks (CNN), and the like.

In general, using simulated high-capacity sensor data for detection and control allows accurate guidance of the vehicle by using replacement sensors that may be relatively inexpensive and readily available compared to high-capacity sensors. In addition, the autonomous control system can use existing control and detection systems that are configured for high-capacity sensor data. Returning to the example above, the autonomous control system may synthesize the sensor data from the set of cameras with different resolution, color, and field-of-view (e.g., front, back, left, and right sides), and the portable RADAR sensor to simulate sensor data from a single LIDAR sensor having a large field-of-view and high resolution. The simulated data may be used as input to existing detection and control systems that use LIDAR sensor data.

Figure 2:
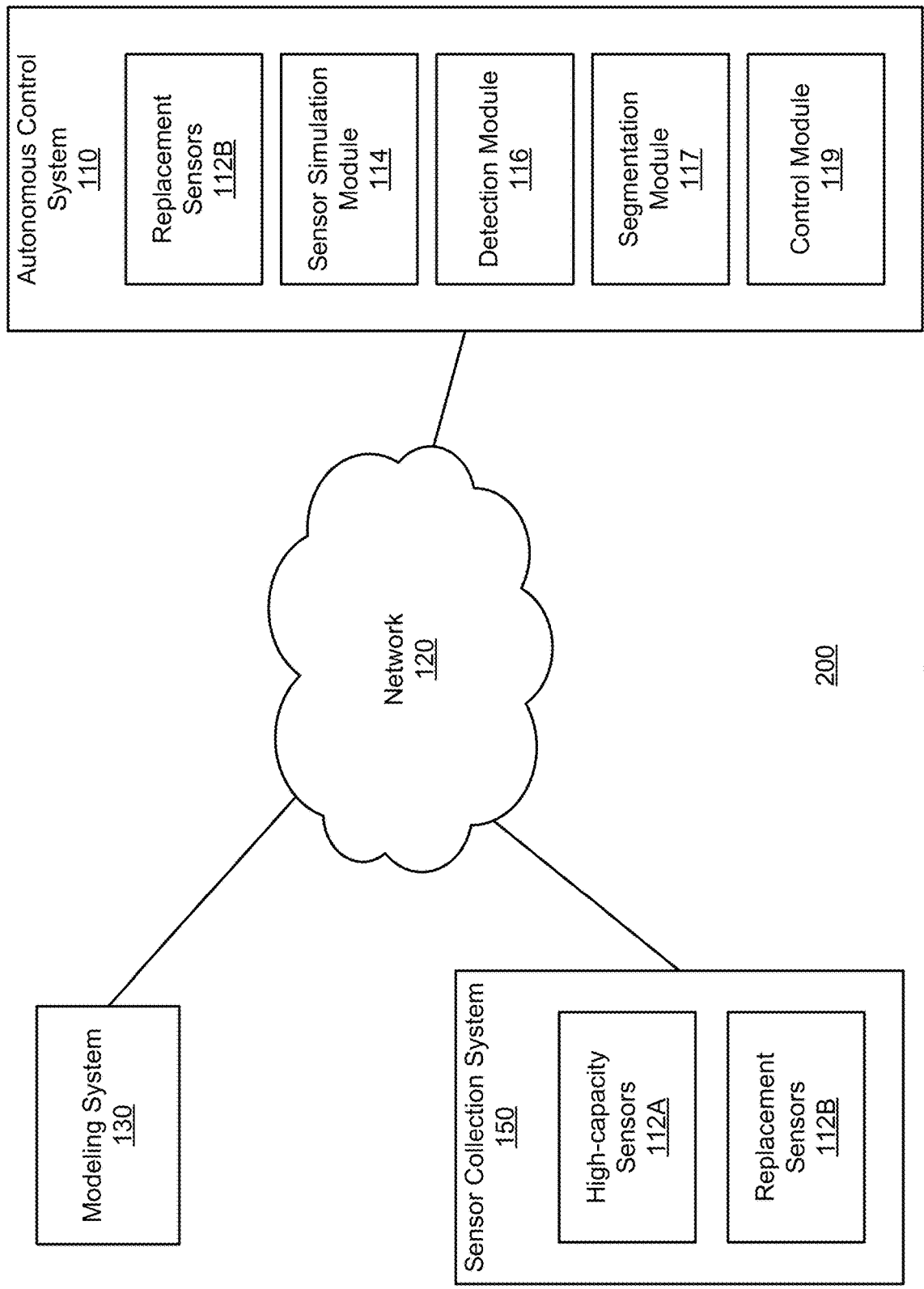
FIG. 2 is an example network environment for autonomous control, in accordance with an embodiment.

FIG. 2 is an example network environment 200 for autonomous control, in accordance with an embodiment. The network environment 200 includes an autonomous control system 110, a sensor collection system 150, and a modeling system 130 coupled to a network 120.

The sensor collection system 150 is attached to one or more data collection vehicles, and includes one or more sensors including high-capacity sensors 112A and replacement sensors 112B. The sensor collection system 150 collects training information related to the physical environment using both the high-capacity sensors 112A and the replacement sensors 112B, such that relationships can be learned between sensor data from the high-capacity sensors 112A and replacement sensors 112B.

The one or more sensors of the sensor collection system 150 can include active sensors and passive sensors. A passive sensor observes the environment. Passive sensors can include cameras, or microphones, vibration sensors, and the like. Passive sensors include a receiver that detects and measures various forms of energy that are naturally emitted from the physical environment or constituents of the physical environment across various locations of the environment. As an example, when the sensor is a camera, the sensor data is a time series of pixel data indicating intensities of detected light. That is, a time series of pictures are acquired. Each picture is divided into pixels and each pixel may have one or more intensity values associated with it depending on whether the camera is a greyscale camera or a color camera. For example, when the camera is a color camera describing a color of a pixel in red, green, and blue, the intensity value for each is typically an integer, such as an 8, 10, or 12-bit integer specifying the intensity of the red, green, or blue portion of the frequency. If the resolution of the picture were 100×100 pixels (having 10,000 total pixels), for every picture, there would be 3 separate channels of 10,000 pixels.

When the sensor is a microphone, the sensor data is a time series of air pressure values. In one embodiment, the time series of air pressure values is converted into a spectrogram. A spectrogram shows a time series of components (strengths) showing a collection of frequency strengths for each time period. The spectrogram is generated from the initial sound waves by a discrete Fourier transform. The size of the sensor data can be adjusted by adjusting the number of frequencies used in the Fourier transform.

When the sensor is a vibration sensor, the sensor data is a time series of physical displacements of the vibration sensor in the system. The vibration sensor is typically attached or near to a particular component of the system to represent vibration of that component. Similarly to the microphone, in one embodiment, the time series of physical displacements are converted into a spectrogram, and the number of frequencies used in the Fourier transform can be adjusted.

The one or more sensors may include active sensors. Active sensors emit energy and then measure the energy that is reflected back to one or more receivers in the sensor. The reflected energy allows active sensors to probe for environmental information that may not otherwise be readily detected passively at the sensor. For example, active sensors may estimate distances of objects from the sensor better than passive sensors. Active sensors include both a transmitter and receiver of energy, in contrast to passive sensors that use receivers. Active sensors can include ultrasound sensors, RADAR sensors, active infrared (IR) sensors, LIDAR sensors, and the like. Usually, ultrasound sensors emit ultrasound waves, RADAR sensors emit microwaves, LIDAR sensors emit laser pulses in the near-IR or visible range waves, and IR sensors emit IR waves.

In one instance, the sensor data includes depth measurements that measures how far away an object is from the sensor. Specifically, the depth is measured by triggering a timer when the energy is emitted, and detecting the amount of time needed for the receiver to detect the reflected energy. The traveling speed of the energy can be used to calculate the depth of objects at various locations in the environment by emitting energy signals in the direction of the objects. In another instance, the sensor data also includes intensity measurements that measures the intensity of the reflected energy detected at the receiver of the sensor. These intensity values may be represented as 8 or 16-bit integer values.

For many types of active sensors, the sensor data is a collection of data points with reference to the sensor in a three-dimensional (3D) coordinate system ("point cloud" measurements) such as, for example, a spherical coordinate system or a Cartesian coordinate system. Each value designates the measurement of the actively-transmitted signal at the receiver (e.g., depth or reflected intensity). The number of data points in the point cloud is related to the resolution of the sensor. Further, even for a given sensor, the number of data points varies depending on factors such as what portion of the environment is within the sensor's range.

For example, when the sensor is a LIDAR sensor, the sensor data may include a point cloud of intensity measurements and a point cloud of reflectance measurements. Specifically, a narrow beam laser is pointed in a specific, known direction. This known direction can be identified as a pair of angles including a polar angle $\theta$ and an azimuth angle $\varphi$ with reference to the sensor. The polar angle $\theta$ specifies from the upward direction (0 degrees) to the downward direction (180 degrees), while the azimuth angle $\varphi$ specifies from the forward direction (0 degrees) to the backward direction (360 degrees).

By actively emitting energy across the entire field-of-view, a set of measurements for depth and/or intensity can be collected for different values of $(r, \theta, \varphi)$, where r denotes the depth measurement of an object (e.g., ground, cars, trees) to the sensor and $\theta$, $\varphi$ together denote the known direction object. Thus, a 3D view of the environment can be mapped to a point cloud representing objects in the environment by using the returned depth and intensity thereof.

In one embodiment, point cloud measurements are collected with rotational scanning. For example, multiple laser beams (e.g. 64 laser beams) can be emitted from a rotating drum, enabling multiple measurements across various values of $\theta$. In this case, $\theta$ and $\varphi$ are pre-determined by the position of the rotating drum and which of the multiple beams emitted the light, while r is measured based on the time-of-flight of the energy beam as discussed above.

In another embodiment, the point cloud measurements are collected by linear scanning in the (x, y) space. In such implementations, the light source is aimed at one or more mirrors. The mirrors, which may be microscopic mirrors (e.g. MEMS mirrors), can be manipulated programmatically, causing the energy beam to be steered. While mirror-based steering could potentially implement almost any scanning pattern, in practice these systems are usually used to implement grid-like scanning patterns that follow the Cartesian coordinate system.

In yet another embodiment, the point cloud measurements are collected through a phased array. A phased array is typically implemented with no moving parts. Instead, a phased array is made up of multiple transmitters at the same frequency but with different phase delay. A beam-like radiation pattern is achieved by the constructive and destructive interference of these multiple beams. The results of this approach can be viewed in polar coordinates or Cartesian coordinates.

Active sensors such as RADAR and LIDAR may output sparse representations of the environment. This sparsity can arise for a few reasons. For example, most active sensors have a minimum and maximum range at which they can reliably receive a returned signal. For example, a LIDAR sensor specifies a minimum usable return range of 0.9 meters and a maximum usable return range of 120 meters. When objects and the ground plane are outside of this range, no return is received, and therefore the returns comprise a sparse point cloud. As another example, even when objects are within range, occlusions such as rain or fog can lead to diffraction of a LIDAR sensor's laser beams. This can lead to fewer returns, which can cause the point cloud to be more sparse compared to the point clouds that are generated in dry weather.

In one particular embodiment, high-capacity sensors 112A refer to LIDAR sensors. The replacement sensors 112B can refer to sensors such as cameras, RADAR, lower-capacity LIDAR, and the like, that are each attached to various positions on the data collection vehicles, which may have smaller capacity than the high-capacity sensors in some aspect. The sensor collection system 150 provides collected training sensor data to the modeling system 130.

The modeling system 130 receives collected sensor data from the sensor collection system 150, and generates models that predict high-capacity sensor data representations of the environment given sensor data from replacement sensors. In one embodiment, the modeling system 130 uses one or more neural networks to generate the simulated high-capacity sensor data. The predictive models are provided to the autonomous control system 110. A more detailed description of the modeling system 130 is described below in conjunction with FIG. 3.

The autonomous control system 110 includes one or more replacement sensors 112B, a sensor simulation module 114, a detection module 116, a segmentation module 117, and a control module 119. The vehicles that include the autonomous control system 110 may lack high-capacity sensors and use the trained models to simulate high-capacity data from replacement sensors. Specifically, the replacement sensors 112B of the autonomous control system 110 may be sensors attached to various positions of the vehicle, similar to the replacement sensors described in conjunction with the sensor collection system 150. The replacement sensors 112B collect information related to the surrounding environment as the vehicle is operating, and provides the information to the sensor simulation module 114.

The sensor simulation module 114 receives predictive models from the modeling system 130 and sensor data generated by the replacement sensors 112B, and simulates a high-capacity sensor data representation of the physical environment.

The detection module 116 detects objects in the scene based on the simulated high-capacity sensor data received from the sensor simulation module 114. Objects may include both stationary and moving items in the scenery of the physical environment. For example, stationary objects may include guard rails, road signs, or traffic cones. As another example, moving objects may include pedestrians, bicyclists, animals, or vehicles.

In one embodiment, the detection module 116 detects objects using the following mechanism. First, the detection module identifies regions of interest (ROIs) in the simulated data which may contain objects. Next, the detection module determines which ROIs contain objects, and then it classifies the objects into categories such as guard rails, road signs, traffic cones, bicyclists, animals, or vehicles. The detection module 116 may use convolutional neural network models to identify ROIs and classify objects. The detection module 116 may perform further functionalities, such as tracking objects across multiple time steps of data.

The segmentation module 117 semantically classifies regions of the scene based on the simulated high-capacity sensor data received from the sensor simulation module 114.

In one embodiment, the segmentation module 117 performs segmentation on the scene and, importantly, identifies regions of the image that are drivable. In one implementation of this embodiment, the segmentation module 117 uses one or more neural networks to perform low-level semantic segmentation, which consists of classifying the type of object or surface that each point in the point cloud represents. Next, the segmentation module performs grouping or smoothing to create contiguous segments. The segmentation module 117 further performs semantic analysis on the contiguous segments. For example, the road segmentation is further decomposed into lane-marking segments.

The control module 119 determines the path that the robot or vehicle should follow, and it actuates the vehicle to follow the determined path.

In one embodiment, the control module 119 determines the path based on the objects and segments identified by the detection module 116 and the segmentation module 117 in the scene. The control module 119 may be instantiated with a basic directive such as "safely make progress in the current lane, and change lanes or park on the shoulder if the current lane becomes unsafe," or an advanced directive such as "drive to a specific street address." The control module acts on its directive by first plotting possible paths on the drivable terrain identified by the segmentation module 117. These paths may be identified using a motion planning algorithm such as Rapidly Exploring Random Tree (RRT) or A-Star. Next, the control module 119 deletes the paths that may conflict with objects on the road that are identified by the detection module 116. Then, the control module 119 selects the optimal path out of the current path set. Finally, the control module 119 actuates the vehicle to follow the selected path. The control module 119 may refresh its path list at a rate of once every few milliseconds.

In one embodiment, the high-capacity sensors 112A and/or the replacement sensors 112B emit sensor data to various modules of the autonomous control system 110 over the network 120 via a network protocol such as Ethernet. In one embodiment, the various modules of the autonomous control system 110 (e.g., the sensor simulation module 114, the detection module 116, the segmentation module 117, the control module 119) are implemented on a centralized computer in a vehicle. In another embodiment, one or more modules of the autonomous control system 110 may be implemented on separate computers. For example, each module may be implemented on its own dedicated computational hardware.

Modeling System

Figure 3:
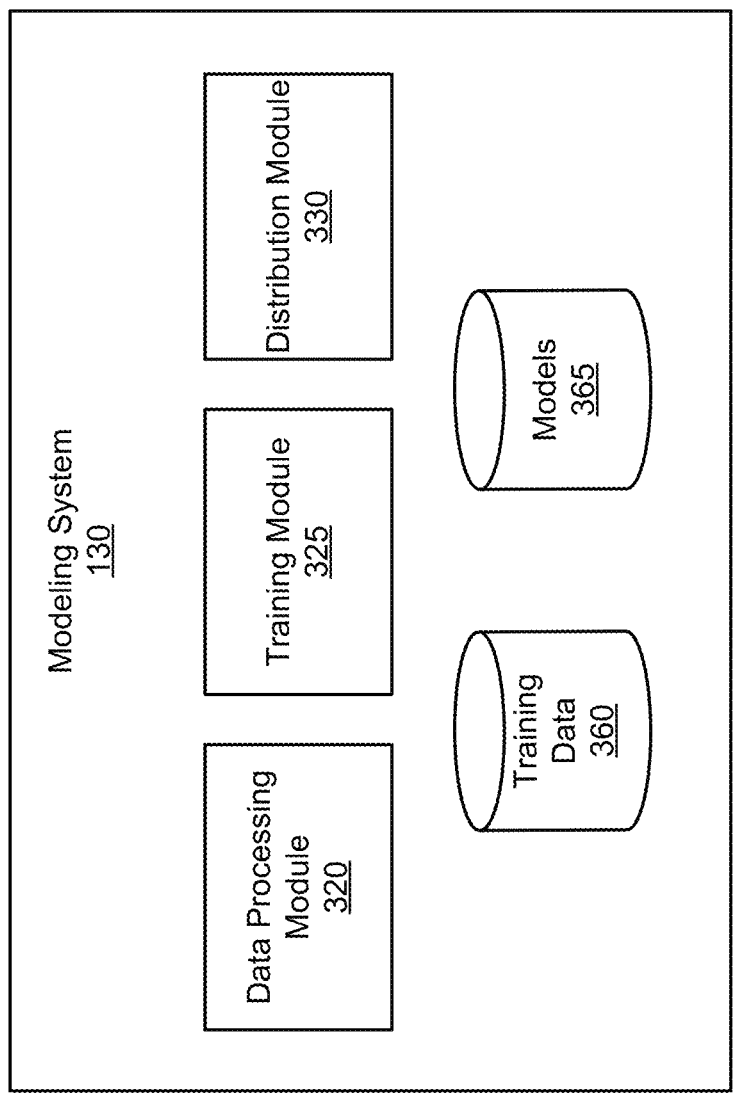
FIG. 3 is an example block diagram of an architecture of the modeling system, in accordance with an embodiment.

FIG. 3 is an example block diagram of an architecture of the modeling system 130, in accordance with an embodiment. The modeling system 130 shown in FIG. 3 includes a data processing module 320, a training module 325, and a distribution module 330. The modeling system 130 also includes a training data store 360 and predictive models 365.

The data processing module 320 receives sensor data from the sensor collection system 150 and encodes the sensor data training data 360 to generate the training data store 360. The training data store 360 includes a set of instances, each instance containing high-capacity sensor data and corresponding sensor data from replacement sensors representing the same portion of the physical environment. For example, the data processing module 320 may represent low-capacity sensor data from a greyscale camera as a vector in which each element corresponds to the intensity value of a single pixel.

In one embodiment, the data processing module 320 transforms sensor data to make sensors mutually compatible, irrespective of sensor positioning and configuration. For example, the data processing module 320 may transform sensor data from one replacement sensor aimed 5 degrees upward with respect to the ground plane into the perspective of a replacement aimed flat with respect to the ground plane. In another embodiment, the data processing module 320 transforms all replacement sensors into representation compatible with a single sensor. This single unified representation may correspond to either a real or virtual sensor. Sensor data transformations may include one or more operations, including affine transformation (including reflection, scaling, rotation, shearing, and so on), perspective transformation, 3D projection, change of basis, and the like.

In one embodiment, the data processing module 320 represents each data point in a point cloud as a vector. In one embodiment, each data point may be represented using a data structure containing an (x, y, z) location. This may be referred to as the coordinate (COO) storage format. In another embodiment, each data point may be represented using a data structure containing polar coordinates (r, θ, φ).

In one embodiment, the data processing module 320 represents each data point in a point cloud as a point cloud dense matrix (PCDM). Some sensors, such as the mirror-based scanning LIDAR sensor, may produce point clouds in which the points are arranged in a grid-based fashion. That is, if an appropriately-sized Cartesian grid was overlaid on top of the point cloud in (x, y) space, each point would fit into one grid cell. However, as mentioned previously, it is common that some of the grid cells are empty. In the PCDM representation, given a sensor that produces a grid-patterned point cloud, the point cloud is overlaid onto a multi-dimensional, most commonly two-dimensional (2D), array that represents a Cartesian grid, and the grid cells for which a point exists in the point cloud is filled in with the corresponding measurement. For example, the measurements may be numerical values indicating reflectance intensity measurements or depth measurements of LIDAR sensors. Empty cells may be filled with a default (e.g. NaN) value.

Figure 4:
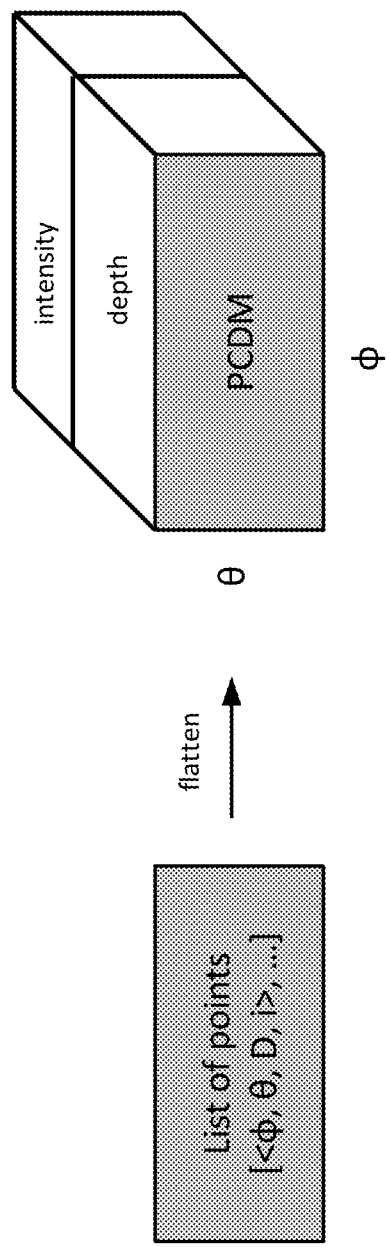
FIG. 4 illustrates an example point cloud dense matrix representation for sensors that generate point clouds expressed in polar coordinates.

FIG. 4 illustrates an example PCDM representation for sensors that generate point clouds expressed in polar coordinates.

Some sensors, such as the rotating mechanical scanning LIDAR sensor, produce point clouds in which the points are organized in rotational bands. These points may not fit into Cartesian coordinates. In such an example, the data processing module 320 may define a multi-dimensional "polar array" in which the dimensions represent polar coordinates. For example, as shown in FIG. 4, the X dimension of the array may represent θ, and the Y dimension of the array may represent φ. At each (θ, φ) index in the array, the depth (r) is stored, and other information, such as intensity, color, temperature, or velocity may also be stored.

In one particular embodiment, the high-capacity sensor data in the training store 360 is high-quality LIDAR sensor data processed into a PCDM structure by the data processing module 320.

In another embodiment, the data processing module 320 represents sensor data as a dense depth map (DDM), where the data processing module 320 uses interpolation techniques to fill in missing points in sensor data. For example, the data processing module 320 may interpolate missing points in a RADAR PCDM matrix based on neighboring points.

In one embodiment, the high-capacity sensor data in the training store 360 is high-quality LIDAR sensor data processed into a dense depth map (DDM) by the data processing module 320.

In one embodiment, the data processing module 320 includes sensor data at a given point in time ("timestep") in each instance of the training data store 360. As an example, an instance for a RADAR replacement sensor in the training data store 360 may include data from a single timestep of 1 second. In another embodiment, the data processing module 320 includes sensor data aggregated from a sequence of timesteps from the replacement sensors in each instance of the training data store 360. This embodiment has the advantage of being able to observe more sensor readings, which may enable it to generate more accurate predictions. In such an embodiment, the data processing module 320 may store the sensor data as a concatenated vector in which sensor data from each time step are concatenated with each other. For example, a training data instance may consist of two seconds of LIDAR readings collected from high-quality LIDAR sensors.

When the dimensions of sensor data are not equal across different instances of the training data store 360, the data processing module 320 may apply one or more data reshaping techniques to the sensor data such that dimensions are equal across all instances of the training data store 360.

In one embodiment, the data processing module 320 re-shapes the sensor data using interpolation techniques. Interpolation techniques may include max-pooling, average-pooling, and bilinear interpolation.

In one embodiment, the data processing module 320 represents sensor data as multi-dimensional arrays of continuous floating-point values. In another embodiment, the data processing module 320 represents sensor data as a multi-dimensional array of values, in which each index of the array indicates a bin. Each bin corresponds to a specific range of values. For example, an index in the array may represent the depth r in a PCDM as the value 1 if the value of r is in the range [0 cm, 1 cm), and as the value 2 if the value is in the range [1 cm, 2 cm), and so on.

The training module 325 receives the training data store 360, and trains one or more predictive models that generate simulated high-capacity sensor data given sensor data from replacement sensors. The training module 316 constructs the one more predictive models based on the training data store 360. Generally, the predictive model captures the dependence between sensor data from replacement sensors and sensor data from high-capacity sensors in the training data 30 such that a loss function is minimized. Specifically, the loss function $l(y_i \in S, u_i \in S; \theta)$ represents discrepancies between values of collected high-capacity sensor data $y_i \in S$ for one or more data instances S in the training data 360, and the simulated sensor data generated using the predictive models $u_i \in S$.

In one particular implementation, the loss function ($y_i \in S$, $u_i \in S$; $\theta$) is a function of the Euclidean distance between $y_i$ and $u_i$ for data instance i in the training data S. In another implementation, the loss function ($y_i \in S$, $u_i \in S$; $\theta$) is a softmax loss when the high-capacity sensor data $y_i$ is represented as an array of values that each indicates whether the sensor data value is within a corresponding bin with a specific range. In such an instance, the loss rewards the model for selecting the correct bin.

The prediction model may be a parametric model in which one or more parameters $\theta$ mathematically specify the dependence between the sensor data from replacement sensors and high-capacity sensors. Typically, various parameters of parametric-type predictive models that minimize the loss function ($y_i \in S$, $u_i \in S$; $\theta$) are determined through gradient-based numerical optimization algorithms, such as batch gradient algorithms, stochastic gradient algorithms, and the like.

To train the replacement sensors to reflect the same equivalent high-frequency data that would occur at the time of the high-capacity sensors, the training of the network may use synchronized data, such that the training data reflects training of the model for replacement sensor data that occurred at the same time as the high-capacity sensors.

In one embodiment, the predictive models are one or more neural networks trained by the training module 325. A neural network (NN) is a system comprised of one or more layers, such that the layers are limited to mathematically differentiable data transformations. Examples of mathematically differential data transformations include, but are not limited to, matrix multiplication, convolution, recurrent layers, max- or average-pooling, and rectified linear units. The neural network models may be trained according to the backpropagation method. The neural network models may receive pre-processed sensor data or the output of the neural network models may be post-processed.

Figure 5A:
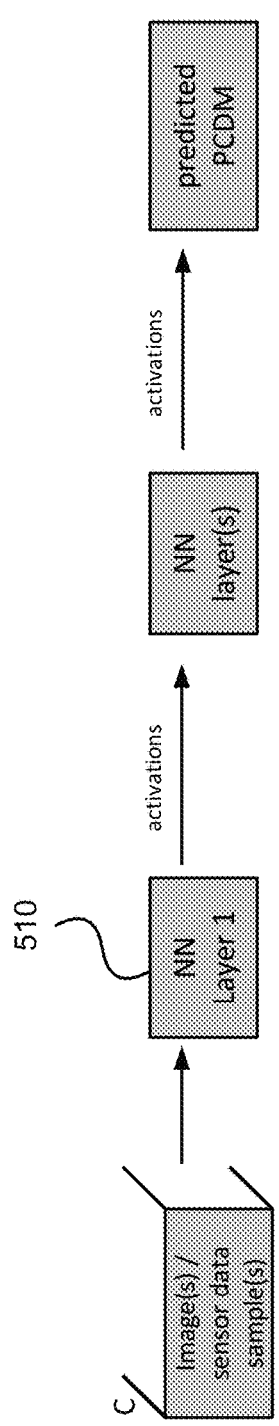
FIG. 5A illustrates an example neural network structure, in accordance with an embodiment.
Figure 5B:
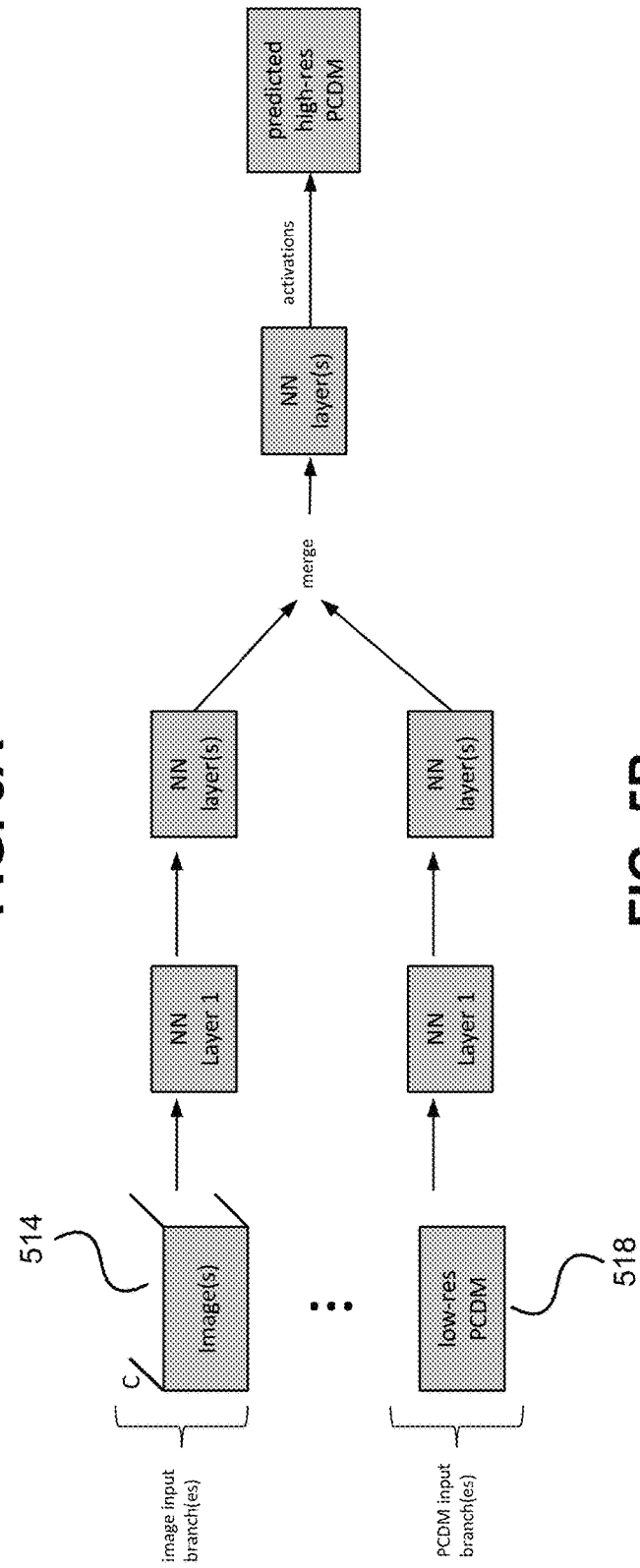
FIG. 5B illustrates an example neural network structure, in accordance with another embodiment.

FIG. 5A illustrates an example neural network structure, in accordance with an embodiment. FIG. 5B illustrates an example neural network structure, in accordance with another embodiment.

In one embodiment, as shown in FIG. 5A, the one or more neural network models have a single-branch structure (SBNN) in which all sensor data from replacement sensors are input into one neural network model layer. As shown in the example of FIG. 5A, the data from all of the replacement sensors in each training data instance is put into layer 510. In one embodiment, the data from each replacement sensor is stored in one or more channels (C) of the input data structure. For example, training data instances of individual timesteps may be input into the SBNN. As another example, training data instances of sequences of timesteps in concatenated form may be input into the SBNN.

In another embodiment of the SBNN model structure, data items from sensor data instances are concatenated in the horizontal and/or vertical dimension to form a panorama that combines the images with overlapping field-of-view into a single image. For example, when there are three cameras camera and two RADARs, the camera data is organized into a panorama in RGB space, and the RADAR data is organized into a panorama. Reshaping is applied to one or both of the panoramas. The camera panorama occupies 3 channels (C) of the SBNN input data structure, and the RADAR data occupies one channel of the SBNN input data structure. In another implementation, instead of using simple concatenation, content-aware panorama stitching techniques may be applied to avoid jagged edges between individual data samples in the panorama.

In another embodiment, as shown in FIG. 5B, the one or more neural network models have a multiple-branch input structure (BINN) in which one or more of the replacement sensor data has its own separate branch of neural network layers in the predictive model. In one particular embodiment, each replacement sensor has a corresponding input data structure to the NN, and each replacement sensor also has its own "branch," consisting of one or more layers. As shown in the example of FIG. 5B, one branch 514 exists for RGB camera images, and another branch 518 exists for low-resolution LIDAR sensor data in PCDM format.

Partway through the NN model, the branches are merged using a mechanism such as concatenation or addition. Having some layers that are unique to each replacement sensor enables the NN to learn the unique behavior of each sensor, and to be robust to each sensor's offset in factors such as timing or spatial orientation. Also, while SBNN models require any sensor-specific data reshaping to occur as a preprocessing step, BINN models can have per-sensor reshaping inside the network structure. In one embodiment, the in-network reshaping may also be implemented using interpolation techniques such as max-pooling, average-pooling, and bilinear interpolation. In another embodiment, the in-network reshaping may be implemented using convolution or deconvolution layers with non-unit strides in which the value of a pixel in the output image of the layer is determined by applying a filtering algorithm to the values of the pixels in the neighborhood of the corresponding pixel in the input image.

In another embodiment, each branch of the neural network model may correspond to different timesteps. In yet another embodiment, each branch of the model may correspond to certain classifications of replacement sensor data. For example, one branch may correspond to all RADAR sensors in the training data 360, and another branch may correspond to all cameras in the replacement data.

Figure 6:
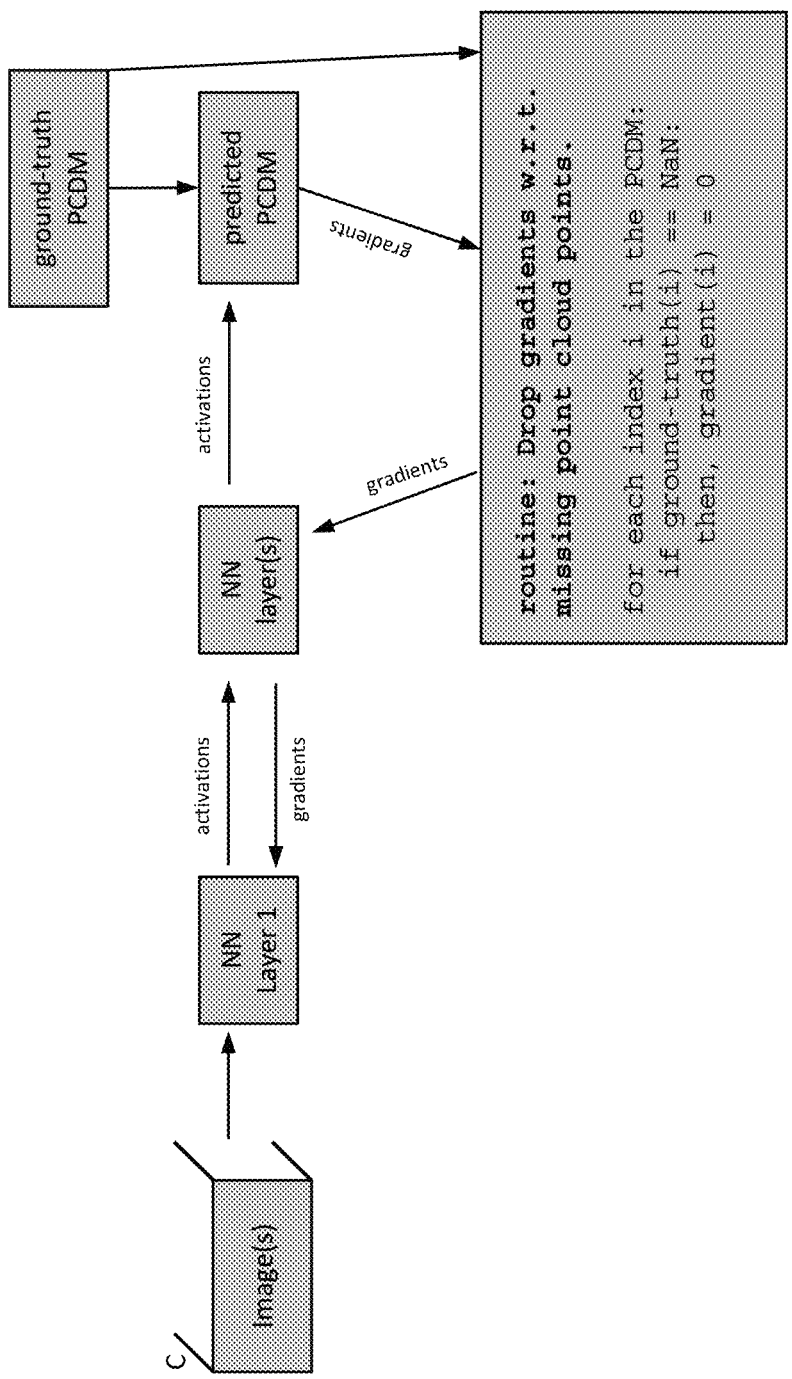
FIG. 6 illustrates an example training process for neural networks, in accordance with an embodiment.

FIG. 6 illustrates an example training process for neural networks, in accordance with an embodiment.

In one embodiment, as shown in FIG. 6, the training module 325 accounts for missing values in sensor data during the training process. Sensor data from active sensors can contain placeholder values such as NaNs that indicate points where the active sensor did not receive a return. Ordinary backpropagation methods do not include a mechanism for addressing missing data. The training module 325 may account for this issue by setting the backpropagation gradient to 0 for indices in the high-capacity sensor data $y_i \in S$ for one or more data instances S in the training data 360 that have missing values. A gradient value of zero has no effect on training, because gradients are typically added to estimated values of the model parameters, and a 0-value gradient means that the estimated value for a parameter for that time step remains constant. Data points with non-missing values are backpropagated.

In one embodiment, the neural network has output channels that produce confidence scores for the correctness of its predictions for the high-capacity sensor data. In one specific implementation, this is achieved by training one of the output channels of the neural network to estimate the distance between the neural network's predicted depth and the depth measured by a high-capacity sensor. In one implementation, confidence scores generated in the sensor simulation module 114 are used to "warn" the control system 119 about regions of the roadway that are not currently understood in detail. For example, these may be regions of the roadway associated with characteristics that were not sufficiently present in the training data set. The control system 119 may use the confidence scores to approach those areas with caution or otherwise affect control based on the confidence that predicted areas are correct, for example to avoid driving towards an unknown area or to reduce speed when approaching an area with low confidence.

In one embodiment, the neural network can generate multiple depth readings for a given position. For a given (x, y) or ($\theta$, $\varphi$) position, some sensors can produce multiple depth (r) readings. For example, when a LIDAR sensor is positioned in front of a glass window, it may perceive both the window and objects behind the window, generating two different depth readings. If a high-capacity sensor is capable of generating multiple depth readings per position, then the neural network can be trained to produce multiple depth readings per position. In one implementation, if the high-capacity sensor data produces up to 10 depth readings per position, then the neural network has ten output channels that contain the neural network's depth predictions.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the invention may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A method of controlling a vehicle with objects identified in a real-world environment with simulated sensor data of the real-world environment, comprising:

receiving sensor data generated by a physical set of sensors on the vehicle that sense the environment of the vehicle with a set of sensing characteristics, the sensor data including a first set of measurements with respect to the sensing characteristics of the sensors, the set of sensing characteristics being indicative of low-capacity sensors;

generating simulated sensor data representing a simulated set of sensors on the vehicle having sensing characteristics being indicative of high-capacity sensors and differing from the set of sensing characteristics of the physical set of sensors, wherein generating simulated sensor data comprises:

applying a machine-learned model to a synthesized input of the sensor data, wherein an output of the machine-learned model includes the simulated sensor data of high-capacity sensors and wherein the simulated sensor data simulates a second set of measurements with respect to the sensing characteristics of the simulated set of sensors, wherein the machine-learned model is configured to output simulated sensor data of high-capacity sensors for a real-world environment based on input of corresponding sensor data of low-capacity sensors for the real-world environment, and wherein the machine-learned model was trained from a first set of low-capacity sensors and one or more high capacity sensors positioned on a data collection vehicle;

identifying the objects in the environment by applying a detection model to the simulated sensor data; and providing guidance on controlling the vehicle based on the identified objects in the simulated sensor data.

2. The method of claim 1, wherein the physical set of sensors detect a first type of signal and the simulated set of sensors simulate a second type of signal different from the first type of signal.

3. The method of claim 2, wherein the physical set of sensors includes at least one of an image sensor, a microphone, or a RADAR sensor, and the simulated set of sensors includes a LIDAR sensor.

4. The method of claim 1, wherein the simulated set of sensors includes a simulated active sensor, and the second set of measurements indicates sensing of a simulated reflectance signal caused by transmitting a simulated energy signal and sensing a reflection of the simulated energy signal in the environment.

5. The method of claim 4, wherein the physical set of sensors includes a passive sensor, and the first set of measurements indicates passive sensing of an external signal from the environment.

6. The method of claim 4, wherein the physical set of sensors includes an active sensor, and the first set of measurements indicates sensing of a reflectance signal caused by transmitting an energy signal from the active sensor and sensing a reflection of the energy signal in the environment.

7. The method of claim 1, wherein the machine-learned model includes a first portion configured to receive sensor data generated by a first subset of the physical sensors and generate a first output, a second portion configured to receive sensor data generated by a second subset of the physical sensors and generate a second output, and wherein the simulated sensor data is generated by synthesizing the first output and the second output.

8. The method of claim 7, wherein the first subset of the physical sensors are active sensors and the second subset of the physical sensors are passive sensors.

9. The method of claim 1, wherein the physical set of sensors includes at least two sensors disposed on different locations on the vehicle having sensing characteristics that differ from one another, and wherein the simulated sensor data is generated for a single simulated sensor.

10. The method of claim 1, wherein the second set of measurements of the simulated set of sensors is represented in polar coordinates that encode information with respect to regions of the environment located at a plurality of angles and distances from the simulated set of sensors.

11. A non-transitory computer-readable medium storing instructions for execution on a processor, the instructions when executed by the processor causing the processer to perform a method of identifying objects in a real-world environment with simulated sensor data, the instructions comprising:
receiving sensor data generated by a physical set of sensors that sense the environment of the physical set of sensors with a set of sensing characteristics, the sensor data including a first set of measurements with respect to the sensing characteristics of the sensors, the set of sensing characteristics being indicative of low-capacity sensors;
generating simulated sensor data representing a simulated set of sensors having sensing characteristics being indicative of high-capacity sensors and differing from the set of sensing characteristics of the physical set of sensors, wherein generating simulated sensor data comprises:
applying a machine-learned model to a synthesized input of the sensor data, wherein an output of the machine-learned model includes the simulated sensor data and wherein the simulated sensor data simulates a second set of measurements with respect to the sensing characteristics of the simulated set of sensors,
wherein the machine-learned model is configured to output simulated sensor data of high-capacity sensors for a real-world environment based on input of corresponding sensor data of low-capacity sensors for the real-world environment, and wherein the machine-learned model was trained from a first set of low-capacity sensors and one or more high capacity sensors positioned on a data collection vehicle; and
identifying the objects in the environment by applying a detection model to the simulated sensor data.

12. The computer-readable medium of claim 11, wherein the physical set of sensors detect a first type of signal and the simulated set of sensors simulate a second type of signal different from the first type of signal.

13. The computer-readable medium of claim 12, wherein the physical set of sensors includes at least one of an image sensor, a microphone, or a RADAR sensor, and the simulated set of sensors includes a LIDAR sensor.

14. The computer-readable medium of claim 11, wherein the simulated set of sensors includes a simulated active sensor, and the second set of measurements indicates sensing of a simulated reflectance signal caused by transmitting a simulated energy signal and sensing a reflection of the simulated energy signal in the environment.

15. The computer-readable medium of claim 14, wherein the physical set of sensors includes a passive sensor, and the first set of measurements indicates passive sensing of an external signal from the environment.

16. The computer-readable medium of claim 14, wherein the physical set of sensors includes an active sensor, and the first set of measurements indicates sensing of a reflectance signal caused by transmitting an energy signal from the active sensor and sensing a reflection of the energy signal in the environment.

17. The computer-readable medium of claim 11, wherein the machine-learned model includes a first portion configured to receive sensor data generated by a first subset of the physical sensors and generate a first output, a second portion configured to receive sensor data generated by a second subset of the physical sensors and generate a second output, and wherein the simulated sensor data is generated by synthesizing the first output and the second output.

18. The computer-readable medium of claim 17, wherein the first subset of the physical sensors are active sensors and the second subset of the physical sensors are passive sensors.

19. The computer-readable medium of claim 11, wherein the physical set of sensors includes at least two sensors disposed on different locations having sensing characteristics that differ from one another, and wherein the simulated sensor data is generated for a single simulated sensor.

20. The computer-readable medium of claim 11, wherein the second set of measurements of the simulated set of sensors is represented in polar coordinates that encode information with respect to regions of the environment located at a plurality of angles and distances from the simulated set of sensors.

21. A method of training a machine-learned model for receiving sensor data generated by a first set of sensors and generating simulated sensor data representing a second set of sensors, the first set of sensors and second set of sensors being physical sensors at respective positions of a data collection vehicle, wherein the method comprises:
obtaining training sensor data generated by the first set of sensors that sense an environment with a set of sensing characteristics, and training sensor data generated by the second set of sensors that sense the environment with sensing characteristics that differ from the sensing characteristics of the first set of sensors, wherein the environment is a real-world environment; and training the machine-learned model configured to receive sensor data generated by the first set of sensors and generate simulated sensor data representing the second set of sensors, the machine-learned model trained by performing one or more iterations of:

generating a set of outputs by applying the machine-learned model with an estimated set of parameters to the training sensor data generated by the first set of sensors, determining a loss function indicating a difference between the set of outputs and the training sensor data generated by the second set of sensors, and updating the set of parameters of the machine-learned model based on the loss function.

22. The method of claim 21, wherein the first set of sensors detect a first type of signal and the second set of sensors simulate a second type of signal different from the first type of signal.

23. The method of claim 22, wherein the first set of sensors includes at least one of an image sensor, a microphone, or a RADAR sensor, and the second set of sensors includes a LIDAR sensor.

24. The method of claim 21, wherein the second set of sensors includes an active sensor, and the training sensor data generated by the second set of sensors indicates sensing of a reflectance signal caused by transmitting an energy signal and sensing a reflection of the energy signal in the environment.

25. The method of claim 24, wherein the first set of sensors includes a passive sensor, and the training sensor data generated by the first set of sensors indicates passive sensing of an external signal from the environment.

26. The method of claim 24, wherein the first set of sensors includes another active sensor.

27. The method of claim 21, wherein the machine-learned model includes a first portion configured to receive sensor data generated by a first subset of the first set of sensors, a second portion configured to receive sensor data generated by a second subset of the first set of sensors, and wherein the set of outputs are determined by combining a first output generated by applying the first portion to the sensor data generated by the first subset of sensors and a second output generated by applying the second portion to the sensor data generated by the second subset of sensors.

28. The method of claim 27, wherein the first subset of sensors are active sensors and the second subset of sensors are passive sensors.

29. The method of claim 21, wherein updating the set of parameters comprises determining a gradient of the loss function with respect to the parameters of the machine-learned model, and setting the gradient to zero if corresponding training sensor data used to determine the loss function is a missing value.

30. The method of claim 21, wherein the set of outputs of the machine-learned model are represented in polar coordinates that encode information with respect to regions of the environment located at a plurality of angles and distances from the second set of sensors.

* * * * *